(12) United States Patent
Thompson et al.

(10) Patent No.: US 7,551,421 B2
(45) Date of Patent: Jun. 23, 2009

(54) CAPACITOR HAVING ELECTRODE TERMINALS AT SAME END OF CAPACITOR TO REDUCE PARASITIC INDUCTANCE

(75) Inventors: Eric Thompson, Burlington, VT (US); Anil K. Chinthakindi, Haymarket, VA (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 11/616,064

(22) Filed: Dec. 26, 2006

(65) Prior Publication Data

US 2008/0151469 A1 Jun. 26, 2008

(51) Int. Cl.
*H01G 4/228* (2006.01)
*H01G 4/005* (2006.01)
(52) U.S. Cl. .................................. 361/306.1; 361/303
(58) Field of Classification Search ............... 361/303, 361/311, 306.1, 308.1
See application file for complete search history.

(56) References Cited

U.S. PATENT DOCUMENTS

| | | | | |
|---|---|---|---|---|
| 4,409,608 A | * | 10/1983 | Yoder | 257/534 |
| 5,583,359 A | | 12/1996 | Ng et al. | |
| 6,542,351 B1 | * | 4/2003 | Kwang | 361/303 |
| 6,570,210 B1 | * | 5/2003 | Sowlati et al. | 257/307 |
| 7,116,544 B1 | * | 10/2006 | Sutardja | 361/306.3 |
| 7,135,366 B2 | * | 11/2006 | Rotella | 438/238 |
| 7,202,548 B2 | * | 4/2007 | Lee | 257/532 |
| 2002/0024087 A1 | * | 2/2002 | Aton | 257/313 |
| 2006/0061935 A1 | * | 3/2006 | Schultz et al. | 361/306.1 |
| 2006/0203424 A1 | * | 9/2006 | Chen et al. | 361/306.1 |

FOREIGN PATENT DOCUMENTS

| | | | |
|---|---|---|---|
| JP | 07169911 A | * | 7/1995 |
| JP | 07283076 A | * | 10/1995 |

OTHER PUBLICATIONS

Imamura et al., "Bending-Comb Capacitor with a Small Parasitic Inductance," Symposium On VLSI Circuits Digest of Technical Papers, 2002, pp. 22-25.

* cited by examiner

*Primary Examiner*—Eric Thomas
(74) *Attorney, Agent, or Firm*—Todd M. C. Li; Hoffman Warnick LLC

(57) ABSTRACT

A capacitor is disclosed having reduced impedance. In one embodiment, the capacitor includes a cathode including a first terminal and a first set of electrodes extending from the first terminal in a first layer, each electrode in the first set coupled to one corresponding electrode of a second set of electrodes in a second layer by at least one contact; and an anode including a second terminal and a third set of electrodes extending from the second terminal in the second layer, each electrode in the third set coupled to one corresponding electrode of a fourth set of electrodes in the first layer by at least one contact, wherein the first terminal and the second terminal are on a same end of the capacitor.

5 Claims, 4 Drawing Sheets

CAPACITOR HAVING ELECTRODE TERMINALS AT SAME END OF CAPACITOR TO REDUCE PARASITIC INDUCTANCE

BACKGROUND OF THE INVENTION

1. Technical Field

The invention relates generally to integrated circuit (IC) chips, and more particularly, to a capacitor having electrode terminals at the same end of the capacitor to reduce parasitic inductance.

2. Background Art

Vertical natural (VN) capacitors are used in integrated circuit (IC) chips. FIG. 1 shows one illustrative conventional capacitor 10 in which inter-digitated cathodes 12 and anodes 14 are generated in a single layer of an IC chip. Each cathode 12 is coupled by a terminal 16, which may be coupled to another layer by contacts 18. Similarly, each anode 14 is coupled by a terminal 20, which may be coupled to another layer by contacts 22. Each terminal 16, 20 includes a tab 24, 26, respectively, for coupling to other circuitry. One challenge relative to capacitor 10 is reducing parasitic inductance, which is caused, in part, by current flowing in opposite directions within capacitor 10, i.e., from/to tabs 24, 26, as capacitor 10 charges. The parasitic inductance lowers the overall quality factor of capacitor 10.

SUMMARY OF THE INVENTION

A capacitor is disclosed having reduced impedance. In one embodiment, the capacitor includes a cathode including a first terminal and a first set of electrodes extending from the first terminal in a first layer, each electrode in the first set coupled to one corresponding electrode of a second set of electrodes in a second layer by at least one contact; and an anode including a second terminal and a third set of electrodes extending from the second terminal in the second layer, each electrode in the third set coupled to one corresponding electrode of a fourth set of electrodes in the first layer by at least one contact, wherein the first terminal and the second terminal are on a same end of the capacitor.

A first aspect of the invention provides a capacitor comprising: a cathode including a first terminal and a first set of electrodes extending from the first terminal in a first layer, each electrode in the first set coupled to one corresponding electrode of a second set of electrodes in a second layer by at least one contact; and an anode including a second terminal and a third set of electrodes extending from the second terminal in the second layer, each electrode in the third set coupled to one corresponding electrode of a fourth set of electrodes in the first layer by at least one contact, wherein the first terminal and the second terminal are on a same end of the capacitor.

A second aspect of the invention provides a capacitor comprising: a cathode including a first terminal and a first set of electrodes extending from the first terminal in a first layer, each electrode in the first set coupled to one corresponding electrode of a second set of electrodes in a second layer by at least one contact; and an anode including a second terminal and a third set of electrodes extending from the second terminal in the second layer, each electrode in the third set coupled to one corresponding electrode of a fourth set of electrodes in the first layer by at least one contact, wherein each electrode of the first set is positioned adjacent to at least one electrode of the fourth set in the first layer and each electrode of the second set is positioned adjacent to at least one electrode of the third set in the second layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
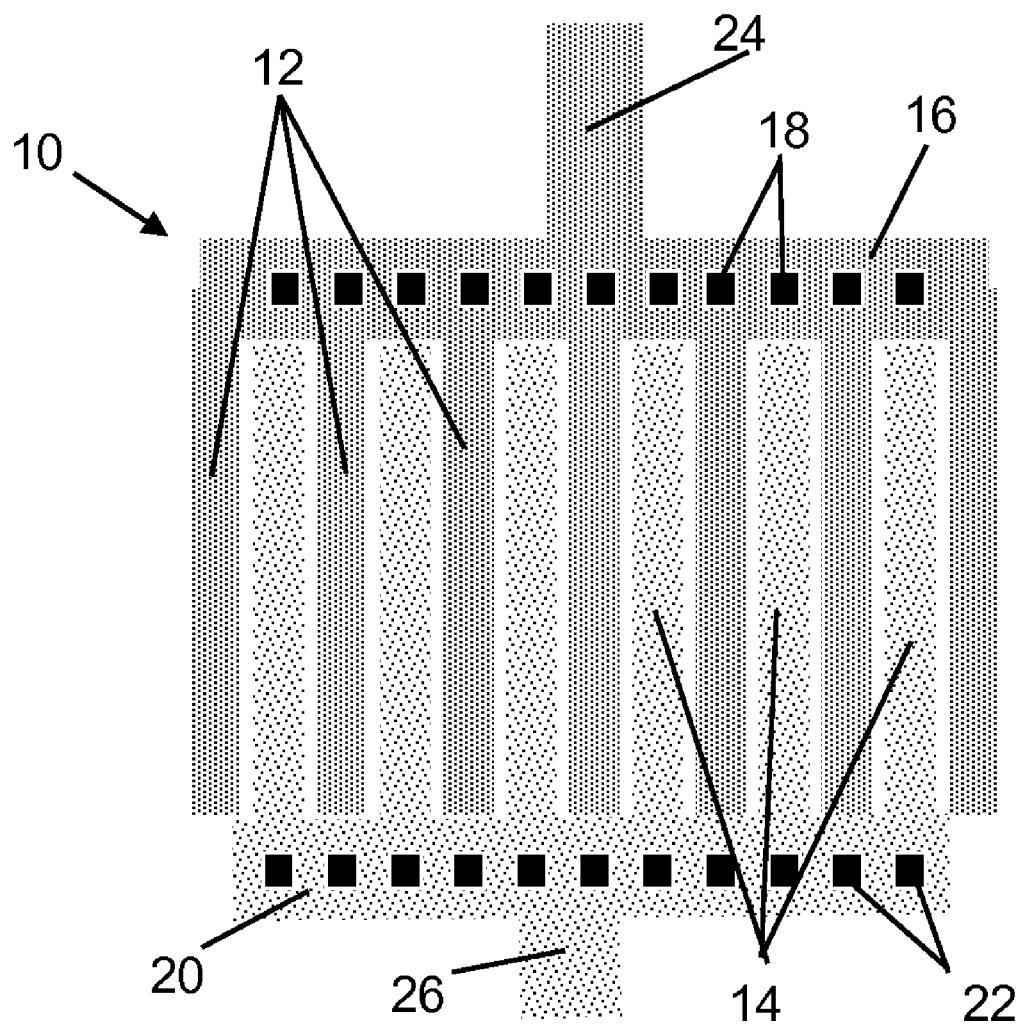
FIG. 1 shows a cross-sectional view of a conventional capacitor.
Figure 2:
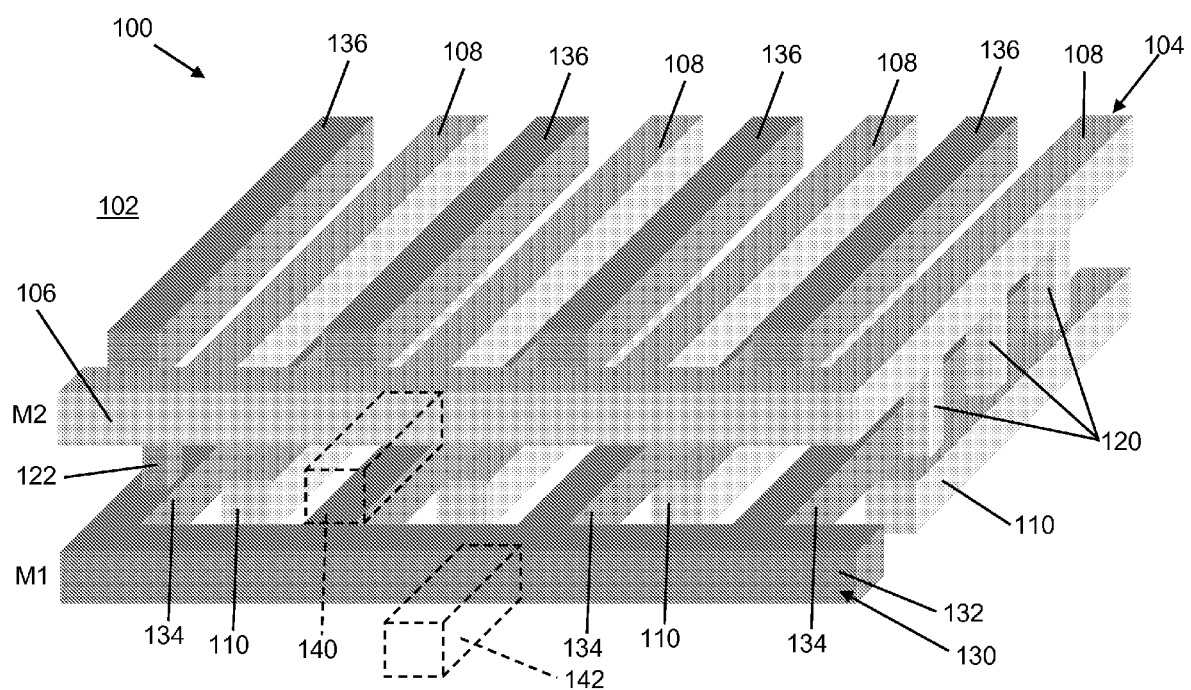
FIG. 2 shows an isometric view of one embodiment of a capacitor.
Figure 3:
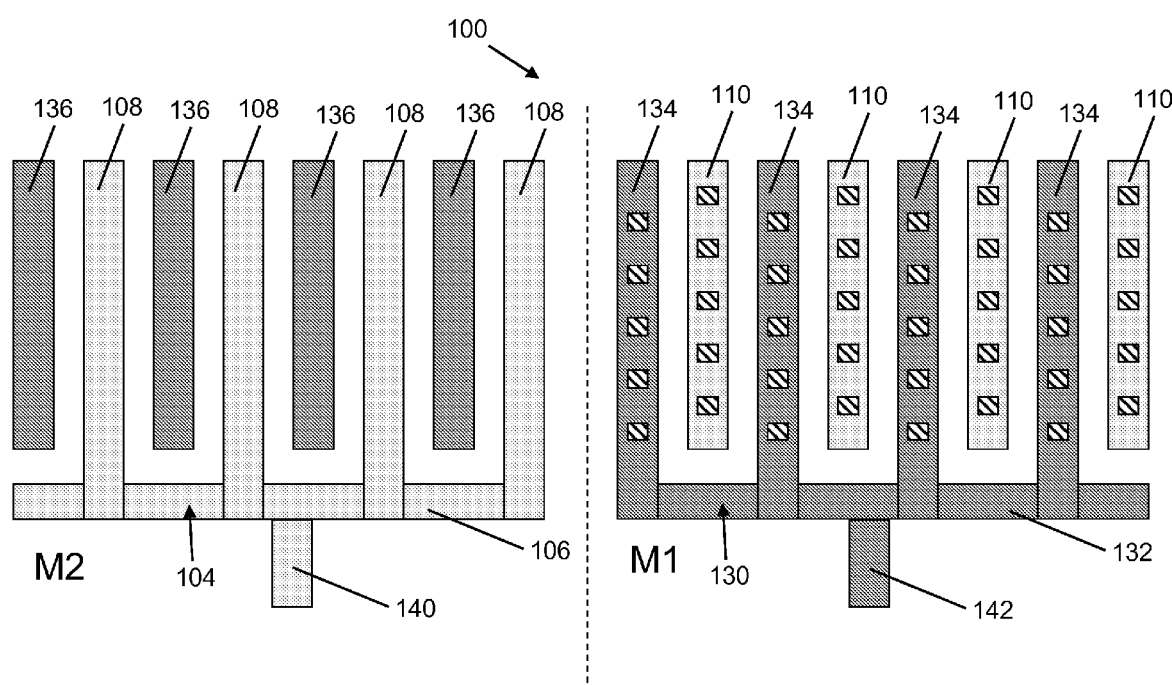
FIG. 3 shows a cross-sectional view of each layer of the capacitor of FIG. 2 side-by-side.
Figure 4:
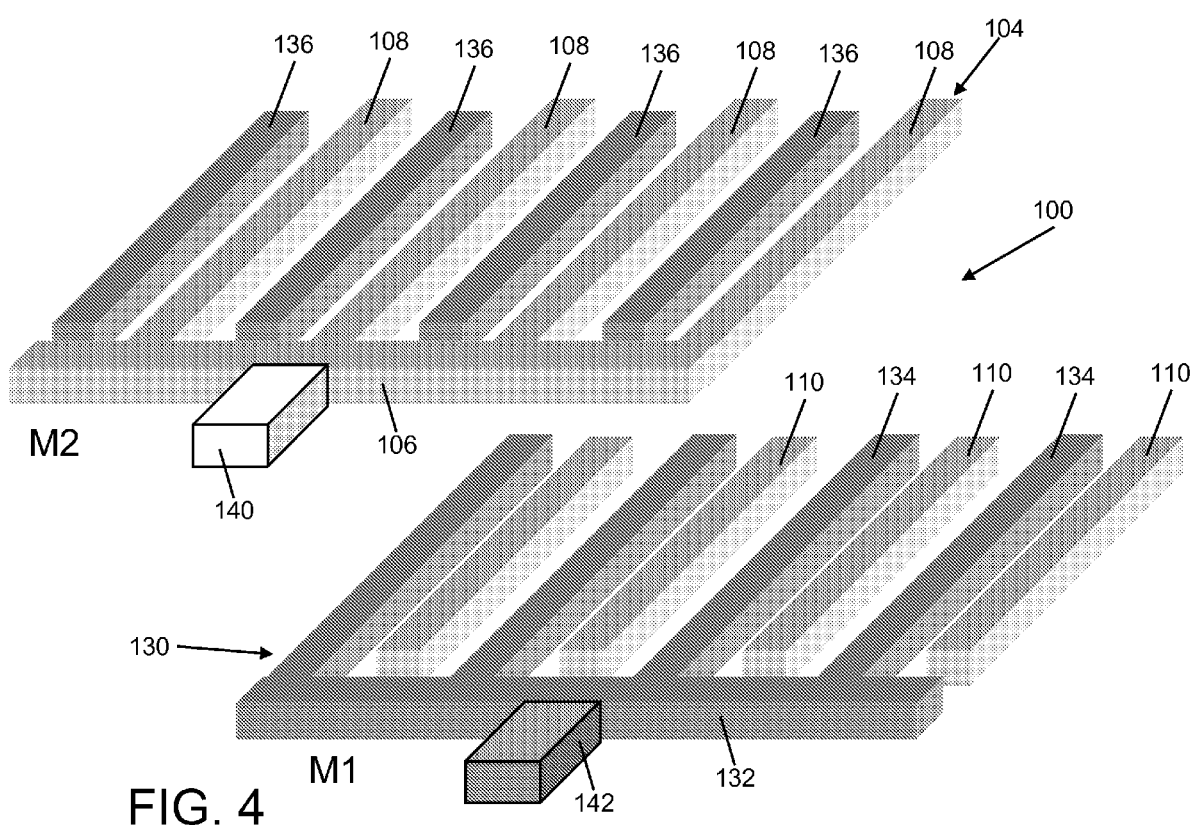
FIG. 4 shows an exploded isometric view of the capacitor layers of FIG. 2 with the layers offset for clarity.

Referring to the drawings, various embodiments of a capacitor are illustrated. FIGS. 2-4 show one embodiment of a capacitor 100. Capacitor 100 is positioned in a plurality of back-end-of-line (BEOL) layers 102 in an integrated circuit (IC) chip. BEOL layers may be any interconnect layer above a first metal layer of an IC chip. Each BEOL layer may include a dielectric material through which interconnects, i.e., vias and wiring, extend. In the drawings, the denotations M1, M2, etc. are used to provide relative positioning and not to denote any particular layer in an IC chip.

Referring to FIGS. 2-4, capacitor 100 includes a cathode 104 including a first terminal 106 and a first set of electrodes 108 extending from first terminal 106 in a first layer (e.g., M2). Each electrode 108 in the first set is coupled to one corresponding electrode 110 of a second set of electrodes 110 in a second layer (e.g., M1) by at least one contact 120. FIG. 2 shows an isometric view of one embodiment of capacitor 100. FIG. 3 shows a cross-sectional view of each layer of the capacitor of FIG. 2 side-by-side. FIG. 4 shows an exploded isometric view of the capacitor layers of FIG. 2 with the layers offset for clarity. Note, in FIG. 2, only contacts on the far right side of the drawing are visible. FIG. 3 shows contacts 120 in cross-section, and contacts are removed from FIG. 4 for clarity.

An anode 130 of capacitor 100 includes a second terminal 132 and a third set of electrodes 134 extending from second terminal 132 in the second layer (e.g., M1). Each electrode 134 in the third set is coupled to one corresponding electrode 136 of a fourth set of electrodes in the first layer (e.g., M2) by at least one contact 122 (shown in left side of FIG. 2 and FIG. 3 only).

Each electrode 108 of the first set is positioned adjacent to at least one electrode 136 of the fourth set in the first layer (e.g., M2) and each electrode 134 of the second set is positioned adjacent to at least one electrode 110 of the third set in the second layer (e.g., M1). In addition, each terminal 106, 132 includes a tab 140, 142 (in phantom in FIG. 2), respectively, for coupling to other circuitry.

In contrast to conventional capacitors, capacitor 100 includes first terminal 106 and second terminal 132 on the same end of capacitor 100. In one embodiment, first terminal 106 in the first layer is positioned over second terminal 132 in the second layer. However, this is not always necessary. As a result of terminals 106, 132 being on the same end, current flows in the same direction in each of the electrode sets, which reduces parasitic inductance.

Note that the position of cathode 104 and anode 130 may be switched.

The capacitors as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A capacitor comprising:
   a cathode including a first terminal and a first set of electrodes extending from the first terminal in a first layer, each electrode in the first set coupled to one corresponding electrode of a second set of electrodes in a second layer by at least one contact; and
   an anode including a second terminal and a third set of electrodes extending from the second terminal in the second layer, each electrode in the third set coupled to one corresponding electrode of a fourth set of electrodes in the first layer by at least one contact,
   wherein the first terminal and the second terminal are on a same end of the capacitor.

2. The capacitor of claim 1, wherein current flows in a same direction in each of the electrode sets.

3. The capacitor of claim 1, wherein each terminal includes a tab for coupling to other circuitry.

4. The capacitor of claim 1, wherein each electrode of the first set is positioned adjacent to at least one electrode of the fourth set in the first layer and each electrode of the second set is positioned adjacent to at least one electrode of the third set in the second layer.

5. The capacitor of claim 1, wherein the first terminal in the first layer is positioned over the second terminal in the second layer.

* * * * *